(12) United States Patent
Moiraghi et al.

(10) Patent No.: US 10,284,120 B2
(45) Date of Patent: May 7, 2019

(54) TRANSMITTING DEVICE AND METHOD FOR WIRELESS TRANSMISSION OF MEASURED PARAMETERS

(71) Applicant: STE INDUSTRIES S.R.L., Milan (IT)

(72) Inventors: Paolo Maria Moiraghi, Marcignago (IT); Mauro Cortese, Limbiate (IT)

(73) Assignee: STE INDUSTRIES S.R.L., Milan (IT)

( * ) Notice: Subject to any disclaimer, the term of this patent is extended or adjusted under 35 U.S.C. 154(b) by 0 days.

(21) Appl. No.: 15/512,032

(22) PCT Filed: Sep. 17, 2014

(86) PCT No.: PCT/IT2014/000247
§ 371 (c)(1),
(2) Date: Mar. 16, 2017

(87) PCT Pub. No.: WO2016/042580
PCT Pub. Date: Mar. 24, 2016

(65) Prior Publication Data
US 2017/0250633 A1    Aug. 31, 2017

(51) Int. Cl.
*H02P 6/16* (2016.01)
*H03B 5/32* (2006.01)
(Continued)

(52) U.S. Cl.
CPC ............ *H02P 6/16* (2013.01); *B60C 23/0447* (2013.01); *B60C 23/0454* (2013.01);
(Continued)

(58) Field of Classification Search
CPC ... B60C 23/0433; B60C 23/0408; H03L 7/16; H02P 6/16; H03B 5/326
See application file for complete search history.

(56) References Cited

U.S. PATENT DOCUMENTS

| 3,515,195 A | * | 6/1970 | Sperberg | ............ | B29D 30/0061 |
| | | | | | 152/153 |
| 5,018,392 A | * | 5/1991 | Mercat | .................. | G01L 25/003 |
| | | | | | 222/32 |

(Continued)

FOREIGN PATENT DOCUMENTS

| EP | 1787831 A2 | 8/2006 | | |
| EP | 2465712 A1 | * | 6/2012 | ......... B60C 23/0452 |

(Continued)

OTHER PUBLICATIONS

International Search Report, International application No. PCT/IT/2014/000247, dated Aug. 7, 2015.

(Continued)

*Primary Examiner* — Berhanu Tadese
(74) *Attorney, Agent, or Firm* — Ferguson Case Orr Paterson, LLP

(57) ABSTRACT

A transmitting device for wireless transmission of measured parameters, which comprises a microcontroller controlling pulse generating means so that said pulse generating means generate at least one pulse position modulation (PPM) signal comprising information corresponding to at least one measured parameter value, wherein said pulse generating means comprise an oscillator and a power amplifier connected to said oscillator in order to amplify the pulses output from said oscillator and to output said PPM signal, and wherein said microcontroller is configured, for each pulse of said PPM signal to be generated, to activate only said oscillator for a first period of time and then to activate also said power amplifier only for a second period of time following said first period of time, said microcontroller being also configured to maintain deactivated said oscillator and said power amplifier outside the time interval defined by said first and second periods of time.

23 Claims, 7 Drawing Sheets

(51) Int. Cl.
   *H03L 7/16* (2006.01)
   *B60C 23/04* (2006.01)

(52) U.S. Cl.
   CPC ...... *B60C 23/0457* (2013.01); *B60C 23/0493* (2013.01); *H03B 5/326* (2013.01); *H03L 7/16* (2013.01)

(56) References Cited

U.S. PATENT DOCUMENTS

| | | | | |
|---|---|---|---|---|
| 6,101,870 | A * | 8/2000 | Kato | B60C 23/0494 73/146.8 |
| 6,271,748 | B1 * | 8/2001 | Derbyshire | B60C 23/0401 340/442 |
| 7,103,460 | B1 * | 9/2006 | Breed | B60C 23/0408 701/29.1 |
| D737,705 | S * | 9/2015 | Moiraghi | D10/86 |
| 9,211,770 | B2 * | 12/2015 | Nagora | B60C 23/0491 |
| 2002/0092347 | A1 * | 7/2002 | Niekerk | B60C 23/009 73/146.2 |
| 2003/0066343 | A1 * | 4/2003 | Fischer | B60C 23/0408 73/146 |
| 2003/0182996 | A1 * | 10/2003 | Bankart | B60C 23/0401 73/146 |
| 2004/0020420 | A1 * | 2/2004 | Evans | B60C 23/02 116/34 R |
| 2004/0130442 | A1 * | 7/2004 | Breed | B60C 11/24 340/443 |
| 2004/0135682 | A1 * | 7/2004 | Lin | B60C 23/0408 340/447 |
| 2004/0157555 | A1 * | 8/2004 | Richenstein | H04H 20/61 455/39 |
| 2004/0257213 | A1 * | 12/2004 | Tsujita | B60C 23/0408 340/445 |
| 2005/0045259 | A1 * | 3/2005 | Hottebart | B60C 23/003 152/415 |
| 2005/0052286 | A1 * | 3/2005 | Perraud | B60C 23/0413 340/12.22 |
| 2005/0162259 | A1 * | 7/2005 | Hotta | B60C 23/0416 340/426.13 |
| 2005/0192727 | A1 * | 9/2005 | Shostak | B60C 11/24 701/37 |
| 2005/0199328 | A1 * | 9/2005 | Schoenberger | B60C 23/0405 152/415 |
| 2005/0273218 | A1 * | 12/2005 | Breed | B60C 11/24 701/2 |
| 2006/0116073 | A1 * | 6/2006 | Richenstein | H04H 20/62 455/3.06 |
| 2006/0248947 | A1 * | 11/2006 | Phalak | B60C 23/0408 73/146 |
| 2007/0116104 | A1 * | 5/2007 | Fujiwara | H04B 1/7183 375/149 |
| 2009/0072959 | A1 * | 3/2009 | Matsumura | B60C 23/0408 340/447 |
| 2010/0018622 | A1 * | 1/2010 | Tanno | B29D 30/0061 152/510 |
| 2010/0090819 | A1 * | 4/2010 | Benedict | B60C 23/0408 340/447 |
| 2010/0134194 | A1 * | 6/2010 | Moiraghi | H03B 5/06 331/116 M |
| 2012/0274461 | A1 * | 11/2012 | Colombo | B60C 23/0408 340/447 |
| 2012/0291933 | A1 * | 11/2012 | Tanno | B60C 19/002 152/209.18 |
| 2013/0063316 | A1 * | 3/2013 | Moiraghi | H01Q 1/3233 343/713 |
| 2016/0214446 | A1 * | 7/2016 | Moiraghi | B60C 23/0479 |
| 2017/0250633 | A1 * | 8/2017 | Moiraghi | B60C 23/0447 |

FOREIGN PATENT DOCUMENTS

| | | | | |
|---|---|---|---|---|
| EP | 2465712 | A1 * | 6/2012 | ........ B60C 23/0452 |
| GB | 1378919 | A * | 12/1974 | ........ B60C 23/0433 |
| GB | 1378919 | A * | 12/1974 | ........ B60C 23/0433 |
| WO | 2011/073928 | | 6/2011 | |
| WO | WO 2012150565 | A2 * | 11/2012 | ........... H03F 3/191 |
| WO | WO-2012150565 | A2 * | 11/2012 | ........... H03F 3/191 |

OTHER PUBLICATIONS

Taiwanese Office Action for Application No. 10820048400; dated Jan. 18, 2019.

* cited by examiner

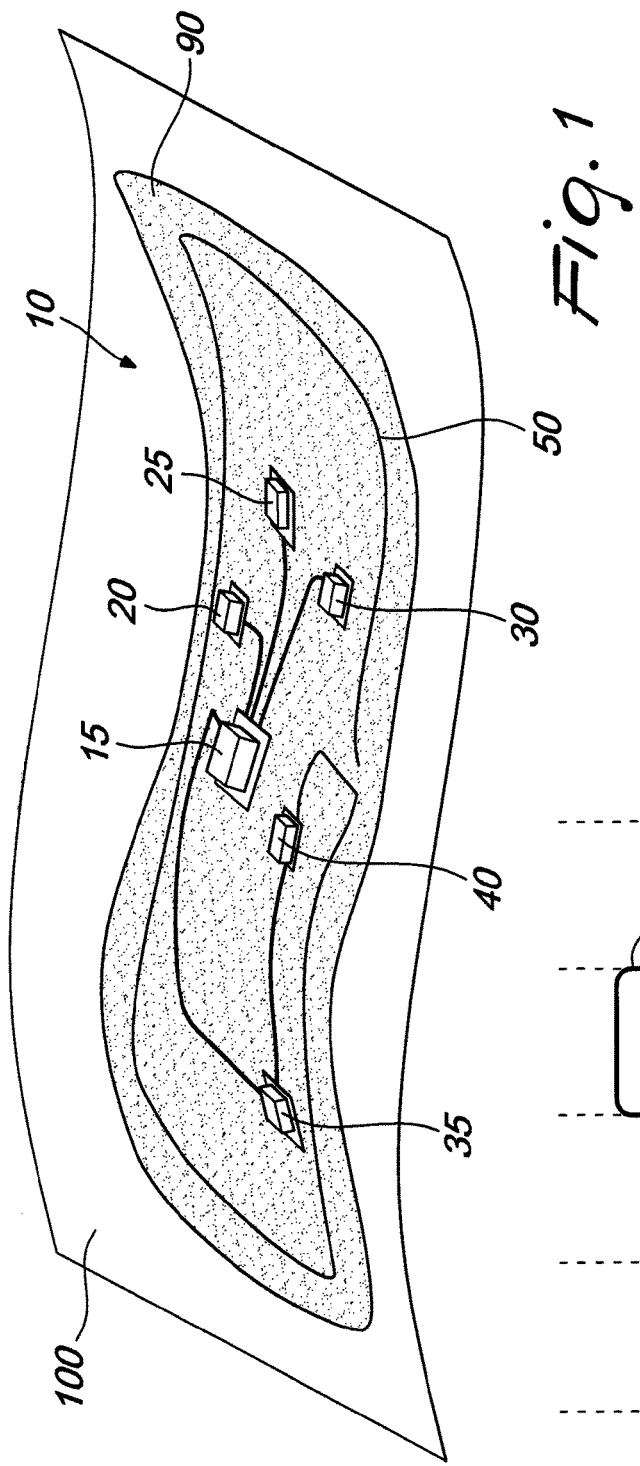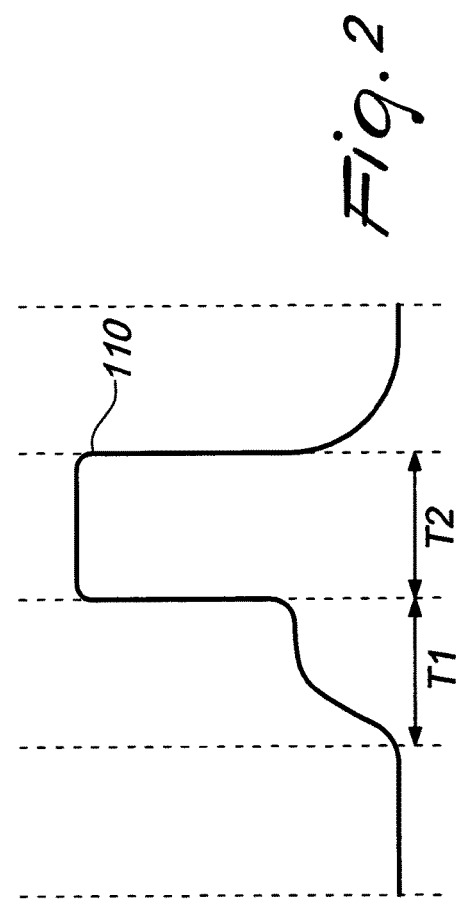

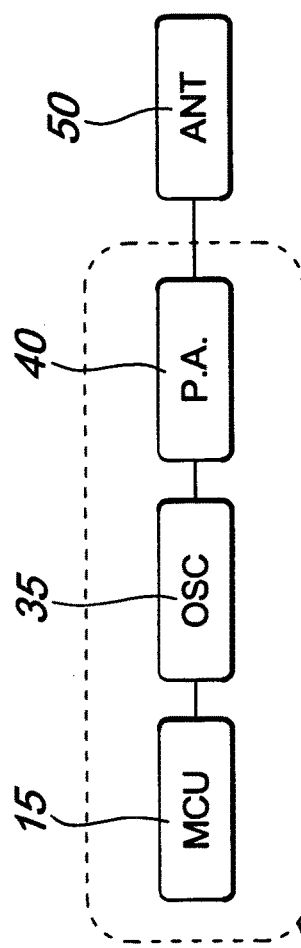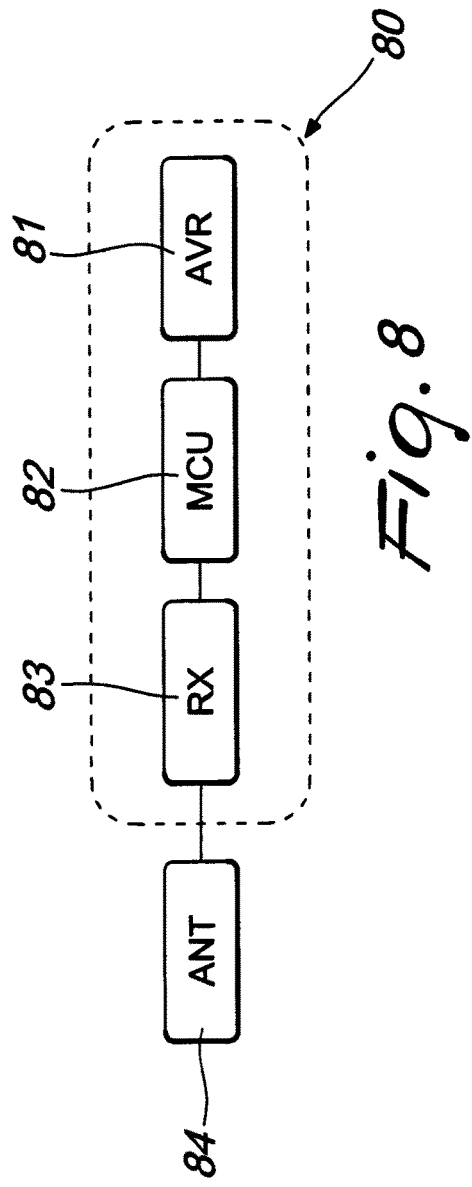

| DESIGNATOR | USED | PART TYPE |
|---|---|---|
| L1 | 1 | 15 nH ±2% |
| L2 | 1 | 56 nH ±5% |
| L3 | 1 | 8.2 nH ±5% |
| C1 | 1 | 100 pF ±5% COG |
| C2, C7, C10, C14 | 4 | 1 nF ±10% 50V X7R |
| C3 | 1 | 7 pF ±0,1pF |
| C4 | 1 | 27 pF ±2% |
| C5 | 1 | 33 pF ±2% |
| C6 | 1 | 47 pF ±2% |
| C8 | 1 | 12 pF ±2% |
| C9 | 1 | 10 pF ±2% |
| C13 | 1 | 22 uF ±20% 6,3V X5R |
| R1 | 1 | 22K Ohm ±1% |
| R2 | 1 | 100 Ohm ±1% |
| R3 | 1 | 22 Ohm ±1% |
| R4 | 1 | 120 Ohm ±1% |
| R5 | 1 | 47 Ohm ±1% |
| R6 | 1 | 2,2K Ohm ±1% |
| R7 | 1 | 15K Ohm ±1% |
| R13 | 1 | 47K Ohm ±1% |
| A1 | 1 | Antenna |
| B1 | 1 | Battery CR1225 |
| Q1, Q2 | 2 | Transistor NPN BFR520T |
| U1 | 1 | Microcontroller MSP430F2012 |
| X1 | 1 | Resonator R964 (434,15 MHz) |

Fig. 10

TRANSMITTING DEVICE AND METHOD FOR WIRELESS TRANSMISSION OF MEASURED PARAMETERS

The present invention generally relates to a device and a method for the wireless transmission of one or more measured parameters, and particularly, but not exclusively, to a device and a method for the wireless transmission of measured parameters of tires, such as the value of the internal pressure of a tire of a vehicle.

BACKGROUND OF THE INVENTION

In the state of the art, devices are known for the transmission of parameters such as temperature, pressure, humidity, strain, etc. which can convert these parameters into strings of data that are then transmitted wireless, for example via radio signals.

These wirelessly transmitting devices usually comprise a transmitting arrangement in order to deliver over the air strings of data, which includes at least one value of a parameter measured by an associated sensor, to an associated receiver adapted to decode such data strings. The communication between the transmitter and the receiver occurs through a specific technique of modulation, and known modulations used in this type of devices are amplitude-shift-keying (ASK), frequency-shift-keying (FSK) and phase-shift-keying (PSK) modulation.

The main reason to adopt a wireless communication architecture on these devices is the possibility to deploy them anywhere, such as in rotating or vibrating structures or in locations that cannot be accessed during normal use or wherever it is not possible or feasible to implement a wired transmission.

A typical application example of these transmitting wireless devices is the maintenance of road vehicles. Recently, with the development of telemetry, systems have been developed for the automatic measurement and/or analysis of vehicle parameters and in particular also of parameters related to tires, such as pressure (Tire Pressure Monitoring System—TPMS).

However, these systems are not used regularly by vehicle operators, since they require high power consumption, due the continuous power supply of the electronic components involved, which must be ensured in order to be able to monitor these parameters.

In fact, due to the absence of wires, supplying sufficient energy to these devices for guaranteeing the transmission of all necessary information and a good reception of the wireless signals is normally a problem that affects the known devices for wirelessly transmitting measured parameters.

For this reason, in the approaches generally adopted for the hardware design of these devices, one of the main problems to be addressed is related to their energy efficiency: a high energy consumption, which may be required for a reliable wireless transmission, would make these devices unusable and uncomfortable in normal operating conditions, because they would be operative only for a short period of time, making it necessary to replace their battery often or even to replace the device itself. While these replacement operations may not be acceptable in normal operating conditions, they become completely unfeasible when the devices are mounted in locations which cannot be normally accessed, such as the inside of a tire.

Such a disadvantage is due to the fact that the known devices for wireless transmission of measured parameters are powered by means of energy sources having some capacity limits. These energy sources can be lithium cells, i.e. an exhaustible battery, that may have a diameter size that ranges between 24 and 48 millimeters.

Furthermore, in a wirelessly transmitting device powered by an exhaustible battery, the size of the battery itself affects the overall mechanical dimensions of the device: the mechanical form factor of this device is directly dependent to the density of the lithium cells, or more in general of the battery, that is measured in cubic centimeters.

In another arrangement, the battery cells of the wirelessly transmitting devices are replaced by energy harvesters, usually smaller than batteries. In this case, even though the power supply is potentially inexhaustible, the overall energy efficiency of the device becomes relevant, since the available power is low or relatively limited.

In other specific areas, the transmitting wireless devices are of "passive" type, wherein energy is supplied by the electromagnetic field generated by an associated electronic reader and the devices are arranged so as to exploit this inductive electromagnetic field to supply the internal electronic circuitry in response to a modulated radio frequency. However, in this case a high energy is demanded to the reader, which results in an overall inefficient system.

SUMMARY OF THE INVENTION

The aim of the present invention is to provide a device and a method that are capable of improving the background art in one or more of the aspects indicated above.

Within the scope of this aim, an object of the invention is to provide a device and a method that allow to wirelessly transmit measured parameters, such as parameters characterizing a tire of a vehicle, while maintaining low power consumption and, consequently, high energy efficiency.

In particular, an object of this invention is to provide a device and a method that allow to generate a pulse for wirelessly transmitting measured parameters which can reduce energy requirements corresponding to the components of the device and, consequently, to the apparatus comprising such a device.

Moreover, an object of the present invention is to provide a device that allows the reduction of its mechanical form factor, i.e. the reduction of its size and of its weight, in particular related of the energy source to be adopted, compared to the known solutions, in order to permit a better and durable grip to the fastening surface of the device.

Another object of the present invention is to provide a method for the communication between the wirelessly transmitting device and the associated receiver which is enough efficient in terms of energy consumption to achieve a durable and redundant system's operability.

A further object of the present invention is to provide a device that is highly reliable, relatively easy to provide and at competitive costs.

This aim, as well as these and other objects that will become better apparent hereinafter, are achieved by a transmitting device for wireless transmission of measured parameters, said transmitting device comprising a microcontroller and pulse generating means connected to said microcontroller, said microcontroller being configured to receive at least one detection signal representative of at least one measured parameter value, said microcontroller being also configured to control said pulse generating means so that said pulse generating means generate at least one pulse position modulation (PPM) signal comprising information corresponding to said at least one measured parameter value, said transmitting device further comprising or being connectable to an antenna for the wireless transmission of said PPM signal, characterized in that said pulse generating means comprise an oscillator and a power amplifier connected to the oscillator in order to amplify the pulses output from said oscillator and to output the PPM signal, and in that said microcontroller is configured, for each pulse of the PPM signal to be generated, to activate only said oscillator for a first period of time T1 and then to activate also said power amplifier only for a second period of time T2 following said first period of time T1, said microcontroller being also configured to maintain deactivated said oscillator and said power amplifier outside the time interval defined by said first and second periods of time T1, T2.

This aim and these objects are also achieved by a method for the generation of a pulse of a pulse position modulation signal bearing information on a measured parameter, characterized by comprising the following steps: maintaining in a deactivated state an oscillator and a power amplifier connected to an output of the oscillator; then, activating only said oscillator for a first period of time T1; at the end of said first period of time T1 and for a second period of time T2 following said first period of time T1, maintaining said oscillator activated and activating also said power amplifier so as to generate a pulse at an output of the power amplifier; at the end of said second period of time T2, deactivating both said oscillator and said power amplifier.

BRIEF DESCRIPTION OF DRAWINGS

The foregoing, as well as further characteristics and advantages of the present invention, will become better apparent to those skilled in the art from the following description of various preferred, but not exclusive, embodiments of the device according to the invention, illustrated by way of non-limiting example in the accompanying drawings, wherein:

FIG. 1 shows a preferred embodiment of the device for wireless transmission of measured parameters according to the invention;

FIG. 2 is a diagram showing the waveform of the pulse generated by the device for wireless transmission of measured parameters according to the invention;

FIG. 7 is a simplified block diagram of an embodiment of the device for wireless transmission of measured parameters comprised in the apparatus according to the invention;

FIG. 8 is a simplified block diagram of an embodiment of the wireless receiving device comprised in the apparatus according to the invention;

FIG. 10 is a table of the components that can be used in the preferred embodiment of the electronic circuit of the device for wireless transmission of measured parameters according to the invention showed in FIG. 9.

DESCRIPTION OF PREFERRED EMBODIMENTS

Figure 3:
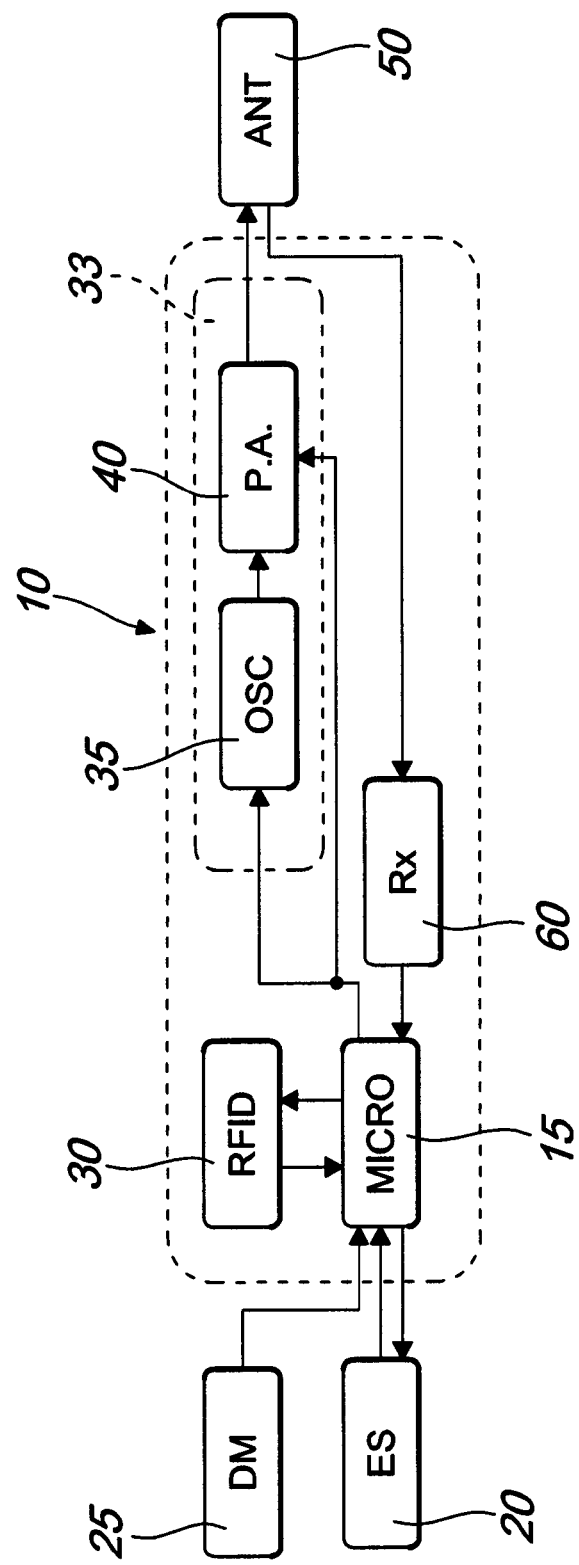
FIG. 3 is a block diagram of a preferred embodiment of the electronic components of the device for wireless transmission of measured parameters according to the invention.
Figure 4:
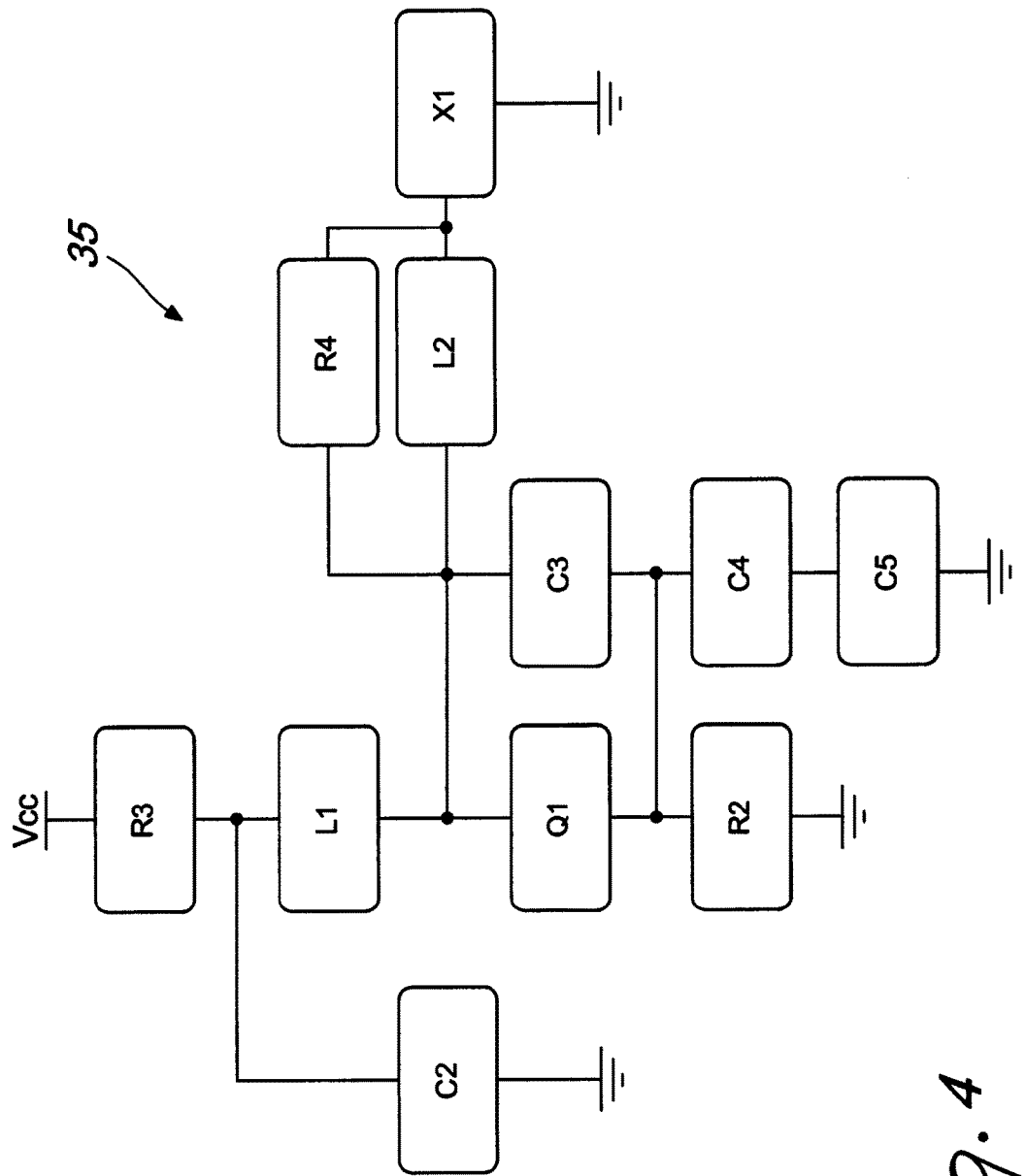
FIG. 4 is a block diagram of a preferred embodiment of the oscillator of the device for wireless transmission of measured parameters according to the invention.
Figure 5:
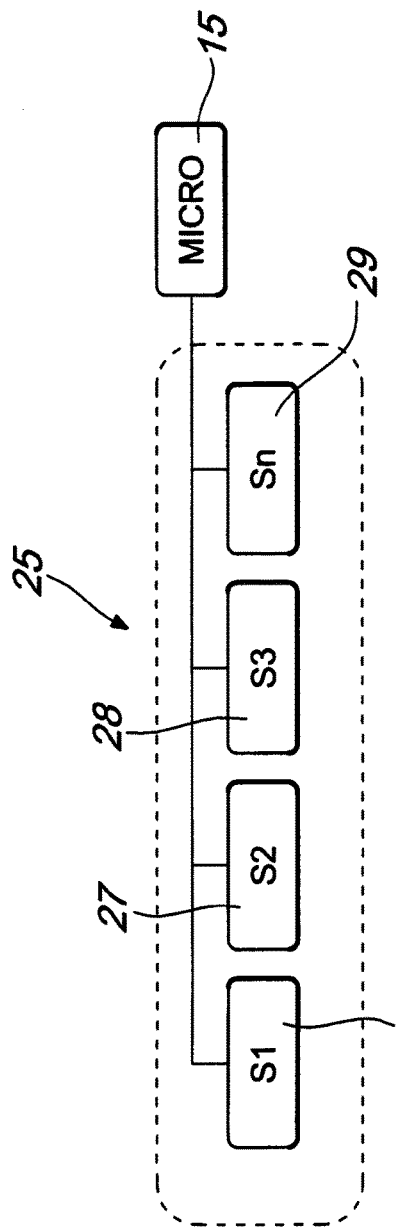
FIG. 5 is a block diagram of a preferred embodiment of the detecting means connected or connectable to the device for wireless transmission of measured parameters according to the invention.
Figure 6:
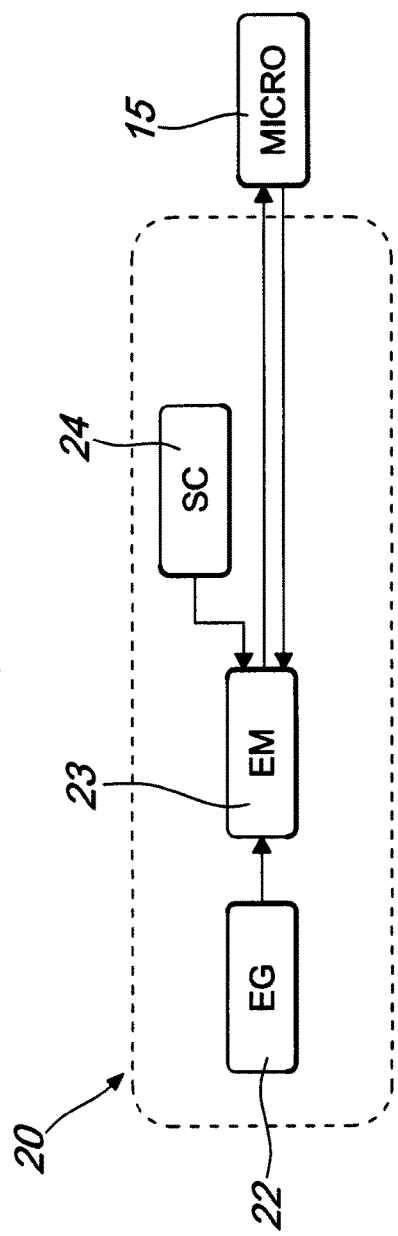
FIG. 6 is a block diagram of a preferred embodiment of the energy source of the device for wireless transmission of measured parameters according to the invention.

The following detailed description and appended figures describe and illustrate various exemplary embodiments of the invention. The description and figures serve to enable one skilled in the art to make and use the invention, and are not intended to limit the present invention, and its applications or uses. It should also be understood that throughout the figures, corresponding reference numerals indicate like or corresponding parts and features.

With reference to the cited figures, a device for wirelessly transmitting measured parameters according to the present invention, generally designated by the reference numeral 10, comprises substantially a microcontroller 15 and pulse generating means 33 connected to the microcontroller 15.

The microcontroller 15 is configured to receive one or more detection signals representative of one or more measured parameter values, such as the value of the internal pressure of a tire. The microcontroller 15 is also configured to control the pulse generating means 33 connected to it, so that they generate one or more pulse position modulation (PPM) signals comprising encoded information corresponding to the measured parameter values previously received by the microcontroller 15 through the detection signals.

The detection signals representative of the measured parameter values originate from detecting means 25 connected or connectable to the microcontroller 15, that are able to detect one or more parameter values and to generate the corresponding detection signals intended to the microcontroller 15.

These detecting means 25 preferably comprise a transducer 26, 27, 28 or 29 for each parameter to detect, and the transducers 26, 27, 28 and 29 may be connected or connectable to the microcontroller 15 separately, for example by means of wires, or together, for example through a bus. A transducer may be an air pressure sensor, a temperature sensor, a strain sensor or a vibration sensor.

In order to perform the wireless transmission of the PPM signals that are generated by the pulse generating means 33 controlled by microcontroller 15 and that carry the measured parameter values, the transmitting device 10 further comprises, or is connectable to, an antenna 50 for transmitting a signal.

The transmitting device 10 for the wireless transmission of measured parameters is included in an apparatus for monitoring parameters, which further comprises a wireless receiving device 80 capable of receiving the wireless PPM signals generated by the transmitting device 10. For example, the apparatus may be incorporated into a vehicle, in order to monitor physical quantities, such as tire parameters, read through the transmitting devices 10. The receiving device 80 preferably comprises a voltage regulator 81, a microcontroller 82 and a receiver 83; the receiving device 80 further comprises, or is connected or connectable to, an antenna 84 for receiving a radio signal.

In a preferred embodiment, the transmitting device 10 is manufactured using the technology solution known as System in Package (SiP), in which a number of integrated circuits are enclosed in a single module, i.e. the package, and the dies containing said integrated circuits are stacked in a vertical configuration on a substrate, such as a ceramic substrate or a FR-4 substrate, making the resultant SiP's footprint much smaller and the resultant SiP's weight much lower than other solutions' ones. Therefore, the technology used for such integration allows a sensible reduction of the module's mechanical form factor through the concentration of multiple integrated circuits, that are stacked one over the other in a functional substrate, along with other embedded elements and surface-mounted discrete components.

Using a System in Package enables a high integrated miniaturization of the module, i.e. of the transmitting device 10, making its footprint not larger than 20×20 millimeters, e.g. 7×7 millimeters.

In the same or in an alternative embodiment, the transmitting device 10 for the wireless transmission of measured parameters may further comprise a flexible or bendable mounting substrate 90, which can be made of materials such as polycarbonate, or a composite material composed of woven fiberglass cloth with an epoxy resin binder that is flame resistant (self-extinguishing), like FR-4.

The transmitting device 10, possibly manufactured as a System in Package and/or comprising this flexible or bendable mounting substrate 90, can be fastened on any surface 100, for example the internal surface of a tire. More in particular, the transmitting device 10 can be bonded into a rubber cavity compatible with a bonding process using adhesive tapes.

A preferred method to secure the transmitting device 10 to a tire, and in particular to the internal surface 100 of a tire, begins by cleaning, e.g. with denatured ethyl alcohol 90°, a portion of the internal surface 100 of the tire which the transmitting device 10 is intended for. Then, a layer of an adhesion promoter such as polyurethane, solvent based primer is spread on the previously cleaned portion of the internal surface of the tire. Said solvent may comprise ethyl acetate. An example of primer that meets these characteristics is the P-94 primer, made by 3M Company.

The use of a primer ensures a better adhesion of the transmitting device 10 to the surface, increases the durability of this adhesion, and provides additional protection for the surface material.

The method continues by applying on the lower face of the transmitting device 10 a double-coated acrylic foam tape, that is a double-sided adhesive tape comprising an acrylic foam layer with a layer of acrylic adhesive coated on both its sides, and finally gluing, with application of a suitable pressure, the transmitting device 10 on said primed portion of the internal surface of the tire by means of said double-coated acrylic foam tape, which reacts to the primer previously spread. An example of double-sided adhesive tape that meets the characteristics above is the PT1500 tape, made by 3M Company.

After the gluing of the transmitting device 10 to the surface 100, if necessary, it is also possible to cover the transmitting device 10 glued to the internal surface 100 with an additional protective single-coated adhesive tape comprising a top layer of ionomer with a layer of acrylic adhesive coated on its bottom side. An example of single-coated adhesive tape that meets these characteristics is the 4412N tape, made by 3M Company. Alternatively, the transmitting device 10 may be covered by means of a plastic wrap.

The above specific method permits to bond the transmitting device 10 to the internal surface of a tire in a very simple way, by using a short working time, and without the need of special tools or materials, and it is particularly effective in the case where the transmitting device is manufactured as a System in Package.

The transmitting device 10 is powered by an energy source 20, such as a battery. A possible battery may be a lithium standard cell or an equivalent flexible or bendable battery.

In an alternative embodiment, the energy source 20 may comprise a generator 22 controlled by an energy management module 23 connected to a capacitor or a supercapacitor 24. Such generator 22 may comprise an energy harvester, for example a piezoelectric, electrostatic or electromagnetic energy harvester, which is a component able to provide a very small amount of power for low-energy electronics.

Energy harvesting (also known as power harvesting) is the process in according to which the energy, coming from alternative and external sources, is captured and saved. These forms of alternative energy sources are all those commonly available in the environment and the process is to convert them into usable voltage.

One of the main sources of usable energy with energy harvesting is piezoelectric: low frequency vibrations, mechanical vibrations, human motion or even acoustic noise are sources of energy that might be converted into electricity. For example a piezoelectric harvester can be advantageously exploited in the invention to convert the mechanical vibrations, e.g. generated by the tire revolution, into a voltage.

As stated, the microcontroller 15 and the generating means 33 are adapted to produce one or more pulse position modulation (PPM) signals; these pulsed radio signals carrying the measured parameter values are per se of a known type.

A PPM signal may comprise at least one frame, comprising a plurality of pairs of pulses encoding the value, or a sequence of values, of at least one measured parameter, such as a pressure value and/or a temperature value, which value or sequence of values are read through the detecting means 25. The first pulse of each pair of pulses ("trigger pulse") is generated at periodic positions in time, i.e. every S1 microseconds (for example, every 300 microseconds), while the second pulse of each pair of pulses ("data pulse") is generated, based on the binary value to be encoded, in a time window positioned n·S2 microseconds after the first pulse (e.g. S2=10 microseconds), wherein n·S2<S1 and n is an integer (1, 2, 3, . . . ) and is associated to a respective predetermined binary value. For example, the data pulse of the pair is generated S2 microseconds after the trigger pulse in order to encode the binary value "00000000", is generated 2·S2 microseconds after the trigger pulse in order to encode a binary value "00000001", and so on. The time interval between the trigger pulse and the data pulse may be comprised between 30 microseconds and 120 microseconds, depending on the message to be encoded.

The message transmitted with the frame may be a 64 bit message composed of 34 pulses and lasting less than 6 milliseconds, e.g. 5.75 milliseconds, wherein a pair of pulses may be used to identify the beginning of the transmission and the remaining 16 pairs of pulses may be used to encode the data to be transmitted.

The PPM signal is not necessarily of the binary pulse type as that described above. As an alternative, the PPM signal may be of the single pulse type, wherein a given data pulse is the trigger pulse of the data pulse that follows.

Therefore, the transport of the information related to the measurements of the parameters is obtained in a known manner by means of a PPM modulation of words that correspond to measurement values, for example of sequences of bits that correspond to an encoding of the measured values, said PPM modulation being followed by a modulation at a given RF carrier frequency for transmission over the air, as described for example in European patent application EP-A-1787831, which is incorporated herein by reference.

The microcontroller 15 has control functions within the transmitting device 10, since it controls the pulse generating means 33 connected to it and the power supply of some components, such as the detecting means 25 and an optional RFID tag 30, as well as it manages the information coming from the detecting means 25 themselves and from an optional receiver 60.

Even though any type of microcontroller can be used to manage the transmitting device 10, the microcontroller 15 is preferably selected of a type of microcontrollers characterized by their extremely low power consumption; an example of microcontrollers that meet this characteristic are the MSP430 family microcontrollers, made by Texas Instruments, such as the MSP430F2012 model.

Figure 9:
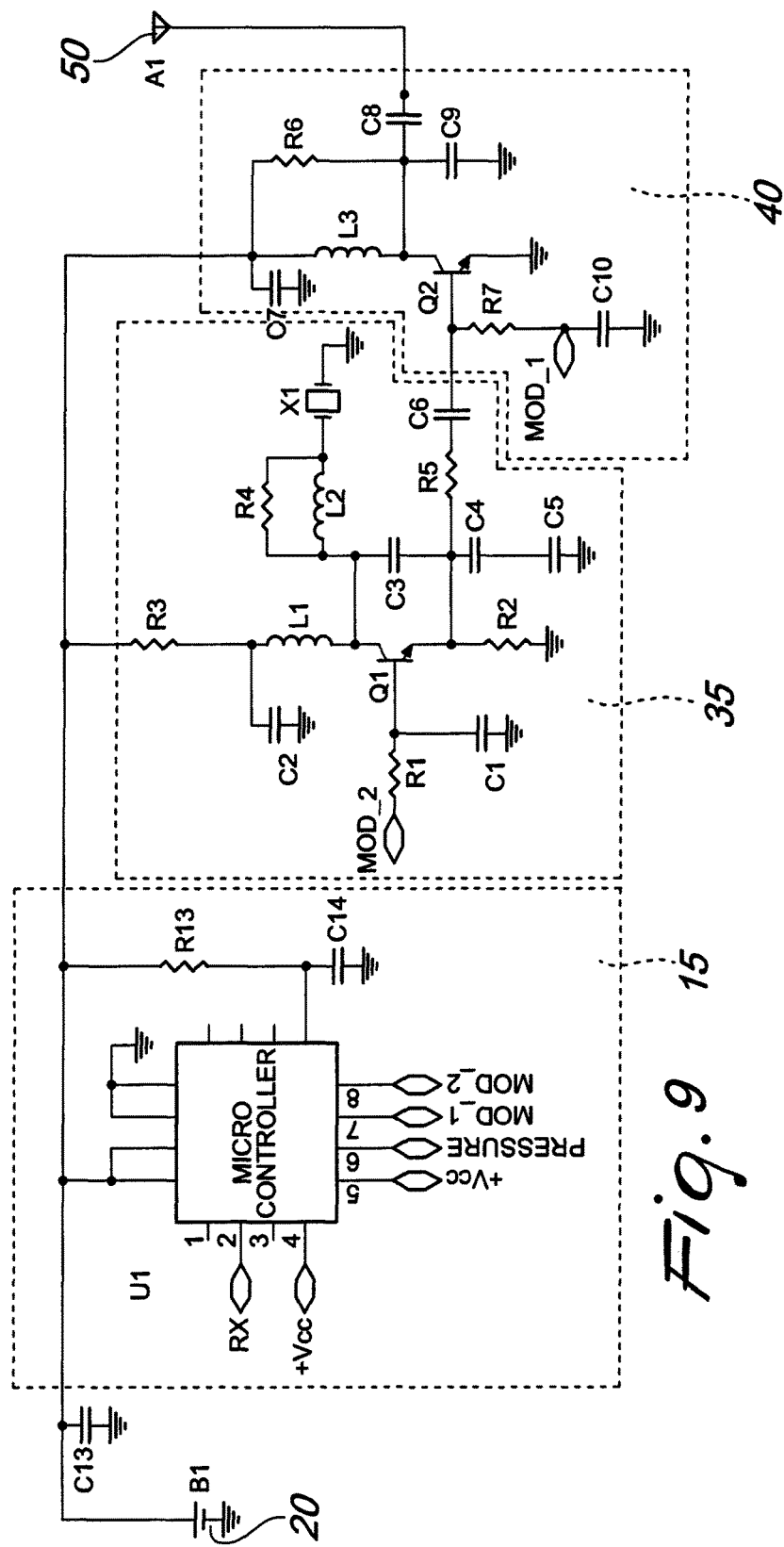
FIG. 9 shows the topology of a preferred embodiment of the electronic circuit of the device for wireless transmission of measured parameters according to the invention.

In a preferred embodiment, using the MSP430F2012 as microcontroller, the following input pins can be identified: pin n. 6 ("PRESSURE", in FIG. 9), which is used for receiving the value of a measured parameter, such as the internal pressure of a tire, from the detecting means 25 (such as an air pressure sensor), and pin n. 2 ("RX", in FIG. 9), which receives the signals coming from an optional receiver 60. The microcontroller 15 of FIG. 9 also features the following output pins: pin n. 7 ("MOD_1"), which sends the control signals for the activation/deactivation of a power amplifier 40 comprised in the pulse generating means 33, and pin n. 8 ("MOD_2"), which sends the control signals for the activation/deactivation of an oscillator 35 comprised in the pulse generating means 33. The signal output from the MOD_2 pin is the triggering signal of the oscillator 35, while the signal output from the MOD_1 pin is the modulating signal that modulates and amplifies the amplitude of the oscillating signal generated by the oscillator 35 so as to generate a pulse 110.

The pulse generating means 33, as already mentioned, comprise an oscillator 35 and a power amplifier 40; the power amplifier 40 is connected to the oscillator 35 in order to amplify the pulses output from the oscillator 35 itself, for example with a power gain comprised between 10 and 20 times, and to output the PPM signal.

Both the oscillator 35 and the power amplifier 40 are controlled by the microcontroller 15, which is configured, for each pulse 110 of the PPM signal to be generated, to activate only the oscillator 35 for a first period of time T1 and then to activate also the power amplifier 40 only for a second period of time T2 following the first period of time T1.

In the first period of time T1 only the oscillator 35 is operative (i.e. switched on) and T1 is chosen so as to allow the frequency of the oscillator 35 reach a stable value Fo, which is preferably a frequency of the ISM (Industrial, Scientific and Medical) band or the SRD (Short Range Device) band between 433.050 Mhz and 434.790 MHz, more preferably 434.400 Mhz. In the second period of time T2 both the oscillator 35 and the power amplifier 40 are operative (i.e. switched on) and, during this second period of time T2, the amplification of the pulse output from the oscillator 35 takes place, generating the pulse 110 of the PPM signal.

In an embodiment of the transmitting device 10, the first period of time T1 is comprised between 1 microsecond and 2 microseconds and the second period of time T2 is equal to 2 microseconds. In a preferred embodiment of the transmitting device 10, the first period of time T1 is equal to 2 microseconds and the second period of time T2 is again equal to 2 microseconds.

The microcontroller 15 is also configured to maintain totally deactivated (i.e. switched off) the oscillator 35 and the power amplifier 40 outside the time interval T1+T2, bringing down to substantially zero the energy consumption of the pulse generating means 33 during the intra-pulse times of the PPM signal.

In an embodiment of the transmitting device 10, the oscillator 35 of the pulse generating means 33 comprises a MEMS (Micro Electro Mechanical Systems) resonator X1 or an equivalent SAW (Surfaced Acoustic Wave) resonator X1, which permits to the oscillator 35 itself to reach a stable value of frequency Fo, which is preferably equal to 434.400 Mhz but which may correspond to another frequency of the ISM band or the SRD band between 433.050 MHz and 434.790 MHz.

The oscillator 35 is stabilized by the MEMS resonator X1 or the equivalent SAW resonator X1 and it comprises a driving circuit so that it is capable of generating fast and accurate RF oscillations at the predetermined frequency Fo, by means of an active element RF transistor Q1, and it is capable of stabilizing and maintain the oscillation on the predetermined frequency Fo, by means of a static capacitance Co of the resonator X1, which allows a fast oscillation start up time, and by means of passive elements, in particular capacitors C2, C3, C4 and C5, inductors L1 and L2, and resistors R2, R3, R4, which sustain and stabilize the oscillation on the predetermined frequency Fo.

In detail, the oscillator 35 comprises a driving circuit, e.g. a Colpitts circuit, which is coupled to a MEMS or SAW resonator X1 by means of the parallel of a resistor R4 and an inductor L2 arranged between the collector terminal of a bipolar transistor Q1 and resonator X1.

The SAW resonator X1 may be represented by an equivalent circuit (not showed in the figures) consisting of a static capacitor Co connected in parallel to the series of a capacitor Cm, an inductor Lm and a resistor Rm (motional capacitor, inductor and resistor) which represent the electric equivalent of the mechanical features of the SAW resonator.

The Colpitts circuit becomes a driving circuit of the SAW resonator X1 and said driving circuit is adapted to supply a voltage Vx to said SAW resonator X1. The driving circuit comprises reactive means, represented by inductor L2 in FIG. 9, having a value suitable to resonate in combination with the static capacitor Co of the SAW resonator X1 at a predetermined frequency Fo in the initial driving period of the resonator at said voltage Vx; the driving circuit also comprises passive means, i.e. resistor R4, adapted to determine and maintain oscillations at said predetermined frequency Fo during operation.

The circuit diagram of a Colpitts circuit is per se known. Said circuit comprises the bipolar transistor Q1 having the base terminal connected to the MOD_2 output of the microcontroller 15, through a low pass filter R1-C1.

Transistor Q1 has the emitter terminal coupled to ground GND by means of a parallel RC network comprising a resistor R2 connected in parallel to a series of two capacitors C4 and C5. The collector terminal of transistor Q1 is coupled to the supply voltage by means of an inductor L1 and a resistor R3; a capacitor C2 is arranged between the supply voltage and ground GND and another capacitor C3 is arranged between the emitter and the collector terminals of transistor Q1.

The output of the oscillator 35 is connected to the power amplifier 40 through a series RC network including a resistor R5 and a capacitor C6.

The power amplifier 40 may comprise a second bipolar transistor Q2 having the base terminal connected to the series RC network R5-C6 of the oscillator 35 and a terminal of a resistor R7 having the other terminal connected to the MOD_1 output of the microcontroller 15, a capacitor C10 arranged between said MOD_1 output and the ground GND.

Transistor Q2 has the emitter terminal coupled to ground GND and the collector terminal coupled to the supply voltage through a parallel RL network including an inductor L3 and a resistor R6. A capacitor C7 is arranged between the supply voltage and ground GND and another capacitor C9 is arranged between the collector terminals of transistor Q2 and ground GND.

Finally, the output of the power amplifier 40 is connected to the antenna 50 passing through a capacitor C8, in order to transmit the generated signal over the air.

As already mentioned, in an embodiment, the transmitting device 10 for the wireless transmission of measured parameters can optionally comprise an RFID (Radio-frequency identification) tag device 30, connected to the microcontroller 15 and capable of storing various information into a non-volatile memory, such as an EEPROM memory, and of providing such information if required. The information stored in the RFID tag device 30 may be, for example, identification code, part number, year of fabrication, ambient temperature or storage temperature, recommended usage and other relevant parameters of a tire.

The optional RFID tag device 30 is connected to the microcontroller 15 in order to provide the information contained into the non-volatile memory to the microprocessor 15 itself and then to wirelessly transmit the provided information through the pulse generating means 33 and the antenna 50, in particular encoded through the first PPM pulses of a PPM signal including at least one measured parameter value.

This RFID tag device 30 may be powered by the energy source 20 of the transmitting device 10, through the microcontroller 15, and it may operate at a frequency that may be comprised in a range between 13.56 MHz and 950 MHz.

In an alternative embodiment, the RFID tag device 30 may be powered by a magnetic field (electromagnetic induction) generated by the reader signal received via the antenna 50. In this case, the RFID tag device 30 may be directly connected to the antenna 50 and it may be a passive ultra-high frequency transponder.

As already mentioned, in an embodiment of the invention, the transmitting device 10 for the wireless transmission of measured parameters may optionally comprise also a receiver 60 connected to the antenna 50 and to the microcontroller 15.

The optional receiver 60 may be comprised in the transmitting device 10 as part of the control circuitry, as it is configured to receive RF signals from the antenna 50 and to pass such signals to the microcontroller 15, these received signals being able to activate and/or configure the transmitting device 10 itself through the microcontroller 15.

The operation of the invention is apparent from the above description.

Starting from an initial situation in which the oscillator 35 and the power amplifier 40 connected to an output of the oscillator 35 are maintained in a deactivated state, the microcontroller 15 PPM encodes the measured data provided by the detection means 25 and, for each pulse of the PPM train to be transmitted over the air, switches on only oscillator 35 for a first period of time T1, through the triggering signal at the MOD_2 output of the microcontroller 15, while the power amplifier 40 is kept in a switched-off state.

Then, at the end of said first period of time T1 and for a second period of time T2 following said first period of time T1, said oscillator 35 is maintained activated, and said power amplifier 40 is switched on through the signal at the MOD_1 output of the microcontroller 15, so as to generate a pulse 110 at the output of the power amplifier 40.

Finally, at the end of said second period of time T2, both said oscillator 35 and said power amplifier 40 are switched off by the microcontroller 15.

Thus, in the first period of time T1 only the oscillator 35 is operative and, during this first period of time T1, the frequency of the oscillator 35 reaches a stable value Fo, which is preferably equal to 434.400 Mhz, generating a pulse of the same frequency; while in the second period of time T2 both the oscillator 35 and the power amplifier 40 are operative and, during this second period of time T2, the amplification of the pulse output from the oscillator 35 takes place, generating the pulse 110 of the PPM signal.

In particular, in an embodiment of the method above, the first period of time T1 is comprised between 1 microsecond and 2 microseconds and the second period of time T2 is equal to 2 microseconds. In a preferred embodiment of the method above, the first period of time T1 is equal to 2 microseconds and the second period of time T2 is again equal to 2 microseconds.

In the light of the above, it has been ascertained that the device, the apparatus and the method according to the present invention achieve the intended aim in an effective manner, since they allow to transmit, by means of pulsed radio signals, one or more measured parameter values, keeping the energy consumption extremely low, which is particularly useful in case of a power supply with a exhaustible battery or, more in general, with an energy source which have some capacity limits.

Although the device, the apparatus and the method according to the invention have been conceived in particular to wirelessly transmit the internal pressure related to the tires of a vehicle, it can be used in any case more generally to wirelessly transmit any parameter which can be measured in some way.

The invention thus devised is susceptible of numerous modifications and variations, all of which are within the scope of the inventive concept; all the details may furthermore be replaced with other technically equivalent elements.

In practice, the materials used, as well as the dimensions, may be any according to the requirements and the state of the art.

Where technical features mentioned in any claim are followed by references signs, the reference signs have been included for the sole purpose of increasing the intelligibility of the claims and accordingly, neither the reference signs nor their absence have any limiting effect on the technical features as described above or on the scope of any claim elements.

One skilled in the art will realize the invention may be embodied in other specific forms without departing from the invention or essential characteristics thereof. The foregoing embodiments are therefore to be considered in all respects illustrative rather than limiting of the invention described herein.

Scope of the invention is thus indicated by the appended claims, rather than the foregoing description, and all changes that come within the meaning and range of equivalence of the claims are therefore intended to be embraced therein.

The invention claimed is:

1. A transmitting device for wireless transmission of measured parameters, said transmitting device comprising: a microcontroller and pulse generating means connected to said microcontroller, said microcontroller being configured to receive at least one detection signal representative of at least one measured parameter value, said microcontroller being also configured to control said pulse generating means so that said pulse generating means generate at least one pulse position modulation (PPM) signal comprising information corresponding to said at least one measured parameter value, said transmitting device further comprising or being connectable to an antenna for the wireless transmission of said PPM signal, wherein said pulse generating means comprise an oscillator and a power amplifier connected to said oscillator in order to amplify the pulses output from said oscillator and to output said PPM signal, and wherein said microcontroller is configured, for each pulse of said PPM signal to be generated, to activate only said oscillator for a first period of time and then to activate also said power amplifier only for a second period of time following said first period of time, said microcontroller being also configured to maintain deactivated said oscillator and said power amplifier outside the time interval defined by said first and second periods of time, that is during the intra-pulse times of said PPM signal, such that energy consumption of the pulse generating means is substantially zero during the intra-pulse times of said PPM signal.

2. The device according to claim 1, wherein said first period is comprised between 1 microsecond and 2 microseconds and said second period is equal to 2 microseconds.

3. The device according to claim 2, wherein said first period is equal to 2 microseconds.

4. The device according to claim 1, wherein the frequency of said oscillator is comprised between 433.050 MHz and 434.790 MHz.

5. The device according to claim 1, wherein said oscillator comprises a MEMS (Micro Electro Mechanical Systems) resonator or an equivalent SAW (Surfaced Acoustic Wave) resonator.

6. The device according to claim 1, wherein detecting means are connected or connectable to said microcontroller and are able to detect at least one parameter value and to generate said at least one detection signal.

7. The device according to claim 1, wherein said transmitting device further comprises a RFID (Radio Frequency Identification) tag device connected to said microcontroller in order to wirelessly transmit the provided information through said pulse generating means and said antenna.

8. The device according to claim 1, wherein said transmitting device further comprises a receiver connected to said antenna and to said microcontroller.

9. The device according to claim 1, wherein said transmitting device comprises an energy source.

10. The device according to claim 9, wherein said energy source is a battery, such as a lithium standard cell or an equivalent flexible or bendable battery.

11. The device according to claim 9, wherein said energy source comprises a generator controlled by an energy management module connected to a capacitor or a supercapacitor.

12. The device according to claim 11, wherein said generator comprises an energy harvester.

13. The device according to claim 1, wherein said transmitting device further comprises a flexible or bendable mounting substrate.

14. The device according to claim 1, wherein said transmitting device is a System in Package device.

15. A tire comprising the device of claim 1.

16. An apparatus for monitoring parameters, said apparatus comprising detecting means capable of measuring at least one parameter value, said apparatus comprising a transmitting device according to claim 1 and a wireless receiving device, said receiving device being capable of receiving a PPM signal coming from said transmitting device.

17. A method for the generation of a pulse of a pulse position modulation (PPM) signal bearing information on a measured parameter, comprising the following steps:
maintaining in a deactivated state an oscillator and a power amplifier connected to an output of the oscillator, during the intra-pulse times of said PPM signal, such that energy consumption of the pulse generating means is substantially zero during the intra-pulse times of said PPM signal;
then, activating only said oscillator for a first period of time;
at the end of said first period of time and for a second period of time following said first period of time, maintaining said oscillator activated and activating also said power amplifier so as to generate a pulse at an output of the power amplifier; and
at the end of said second period of time, deactivating both said oscillator and said power amplifier.

18. The method according to claim 17, wherein said first period is comprised between 1 microsecond and 2 microseconds and said second period is equal to 2 microseconds.

19. The method according to claim 18, wherein said first period is equal to 2 microseconds.

20. The method according to claim 17, wherein the frequency of said oscillator is comprised in the range between 433.050 MHz and 434.790 MHz.

21. A method for the transmission of a PPM radio signal representing at least one measured parameter value through PPM modulation of words that correspond to said at least one measured parameter value, comprising the step of generating a pulse of the PPM radio signal by the transmitting device according to claim 1.

22. A method for fastening of a transmitting device to an internal surface of a tire, comprising the following steps:
cleaning a portion of said internal surface of said tire with denatured ethyl alcohol 90°;
spreading a layer of a polyurethane, solvent based primer, said solvent comprising ethyl acetate, on said portion of said internal surface of said tire;
applying on the lower face of said device a double-coated acrylic foam tape; and
gluing said transmitting device on said portion of said internal surface of said tire by means of said double-coated acrylic foam tape, which reacts to said primer previously spread.

23. The method according to the claim 22, further comprising the step of covering said transmitting device glued to said internal surface of said tire with an additional protective single-coated adhesive tape comprising a top layer of ionomer with a layer of acrylic adhesive coated on its bottom side.

* * * * *